United States Patent
Nishioka et al.

(10) Patent No.: US 6,207,305 B1
(45) Date of Patent: Mar. 27, 2001

(54) CORROSION-RESISTANT MEMBERS AGAINST A CHLORINE-BASED GAS

(75) Inventors: Masao Nishioka, Tokoname; Naotaka Kato, Owariasahi, both of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/413,128

(22) Filed: Oct. 6, 1999

(30) Foreign Application Priority Data

Oct. 7, 1998 (JP) .................................................. 10-285290

(51) Int. Cl.[7] .................................................. B32B 9/00
(52) U.S. Cl. ............................................. 428/698; 428/938
(58) Field of Search ...................................... 428/212, 338, 428/408, 446, 698, 938; 219/402, 409, 459, 385; 392/388, 416

(56) References Cited

U.S. PATENT DOCUMENTS

| | | | |
|---|---|---|---|
| 5,231,690 | * 7/1993 | Soma et al. | 392/416 |
| 5,306,895 | * 4/1994 | Ushikoshi et al. | 219/385 |
| 5,490,228 | * 2/1996 | Soma et al. | 392/416 |
| 5,565,247 | * 10/1996 | Suzuki | 427/562 |
| 5,800,618 | * 9/1998 | Niori et al. | 118/723 E |

FOREIGN PATENT DOCUMENTS 0 506 391  9/1992 (EP).
0 911 307  4/1999 (EP).

OTHER PUBLICATIONS

Database WPI Section Ch, Week 199805 Derwent Publications Ltd., London, GB; Class L03, AN 1998–046866 XP002140873 & JP 09295882 A (NGK Insulators Ltd) Nov. 18, 1997 abstract.

Patent Abstracts of Japan vol. 014, No. 460 Oct. 4, 1990 & JP 02 183718 A (Mitsui Eng & Shipbuild Co Ltd), Jul. 18, 1990 abstract.

Patent Abstracts of Japan vol. 1999, No. 08, Jun. 30, 1999 & JP 11 060356 A (Shin Etsu Chem Co Ltd), Mar. 2, 1999 abstract.

* cited by examiner

*Primary Examiner*—Timothy M. Speer
*Assistant Examiner*—Bryant Young
(74) *Attorney, Agent, or Firm*—Burr & Brown

(57) ABSTRACT

A corrosion-resistant member against a chlorine-based gas, which member is to be exposed to a chlorine-based gas atmosphere at temperatures of not less than 600° C. and includes a sintered body made of aluminum nitride and a film of silicon carbide covering a surface of the sintered body and formed by chemical vapor deposition.

1 Claim, 5 Drawing Sheets

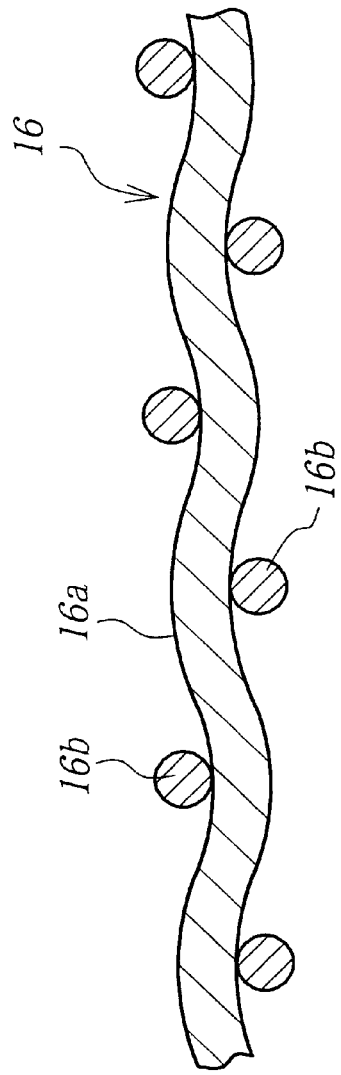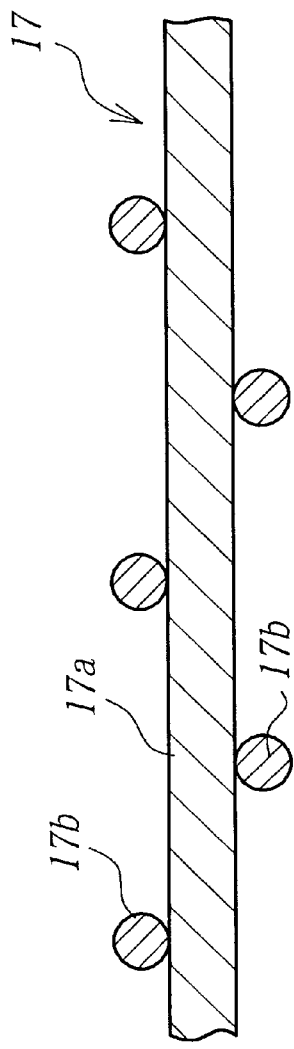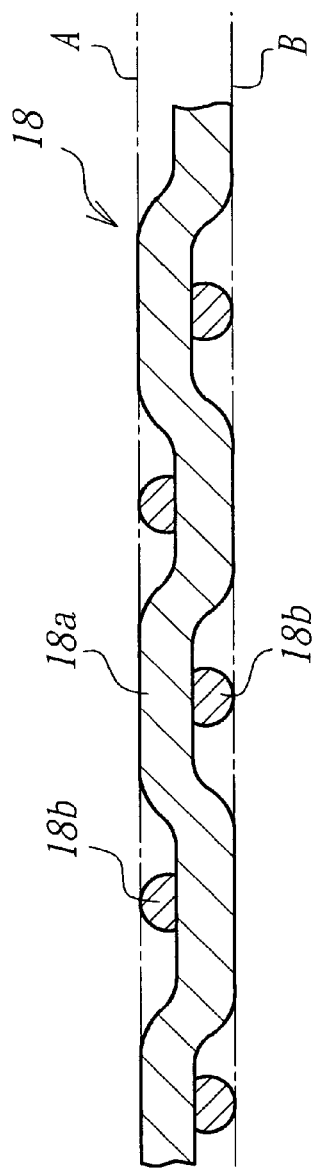
FIG. 3a
FIG. 3b
FIG. 3c

CORROSION-RESISTANT MEMBERS AGAINST A CHLORINE-BASED GAS

BACKGROUND OF THE INVENTION (1) Field of the Invention

The present invention relates to corrosion-resistant members to be exposed to a chlorine gas-based atmosphere at not less than 600° C.

(2) Related Art Statement

In the current film-forming processes such as the hot CVD (chemical vapor deposition), the plasma CVD and sputtering for semiconductor wafers, a heater is necessary for heating such a semiconductor wafer. NGK Insulators, Ltd. proposed aluminum nitride sintered bodies having high corrosion resistance against the halogen-based corrosive gas as substrates for heaters. Particularly, it is known that the dense aluminum nitride sintered body is a highly heat-conductive material, and its volume resistivity is not less than $10^8$ Ω-cm. Therefore, the dense aluminum nitride sintered body is advantageous as a substrate in the heater for producing the semiconductors.

NGK Insulators, Ltd. repeatedly and variously investigated materials for producing the semiconductors, and proposed substrates which have heat resistance, heat impact resistance and corrosion resistance against halogen-based corrosive gas particularly improved by surface-coating a sintered body of aluminum nitride with a dense film of silicon carbide.

However, a heater has not been known yet, which could heat semiconductors up to not less than 600° C. without causing contamination thereof under the condition that the heater is exposed particularly to the chlorine based corrosive gas. Further, a heater has not been known yet either, which would not cause peeling or degradation of a corrosion-resistive film even after being exposed to the chlorine-based corrosive gas at a high temperature range of not less than 600° C. upon application of heat cycles to the heater between a low temperature and such a high temperature range.

SUMMARY OF THE INVENTION

It is an object of the present invention to provide a corrosion-resistant member having a high corrosion resistance against a chlorine-based gas at temperatures of not less than 600° C.

It is another object of the present invention to provide a corrosion-resistant member, the surface of which is not deteriorated or peeled upon application of heating cycles to the member through exposure to the chlorine-based gas at 600° C. and a low temperature. It is a further object of the present invention to provide a heater suitable for semiconductors, which is resistant to heat cycles and does not cause contamination of the semi-conductors.

The present invention relates to the corrosion-resistant member, especially a member will corrosion resistance to a chlorine-based gas, wherein said member is exposed to a chlorine-based gas atmosphere at temperatures of not less than 600° C. and comprising a sintered body made of aluminum nitride and a film of silicon carbide covering a surface of the sintered body and formed by chemical vapor deposition.

These and other objects, features and advantages of the invention will be apparent from reading of the following description of the invention when taken in conjunction with the attached drawings, with the understanding that some modifications, changes and variations could be easily made by the skilled person in the art to which the invention pertains.

BRIEF DESCRIPTION OF THE DRAWINGS

For a better understanding of the invention, reference is made to the attached drawings, wherein:

FIGS. 3(a), 3(b) and 3(c) show various examples of network members for network members;

DETAILED DESCRIPTION OF THE INVENTION

Figure 1A:
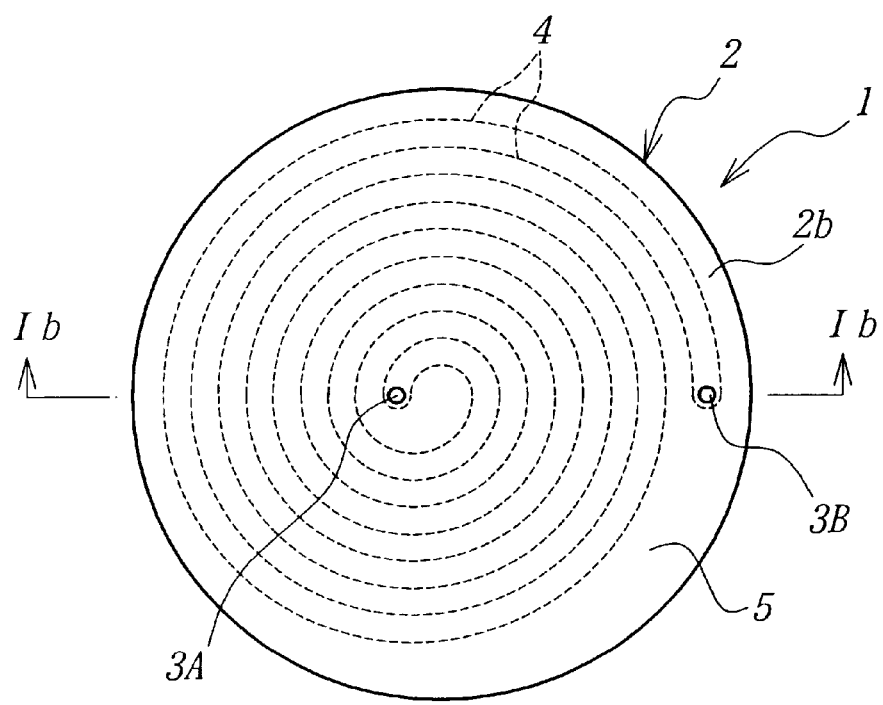
FIG. 1(a) is a plane view schematically showing a heater according to one embodiment of the present invention, FIG. 1(b) being a sectional view of FIG. 1(a) taken along with a line Ib—Ib.

The present inventors discovered that corrosion-resistant members in which a substrate made of a sintered body of aluminum nitride is surface-coated with a film of silicon carbide by chemical vapor deposition exhibit high corrosion resistance against chlorine-based gases at 600° C. or more, particularly 1000° C. or more, and then the inventors reached the present invention.

NGK Insulators, Ltd. disclosed that high corrosion resistance can be realized against fluorine-based corrosive gases in a temperature range of, for example, not less than 300° C. by providing a film of a corrosive-resistant film of aluminum fluoride on a surface of aluminum nitride. However, when such corrosion-resistant members were exposed to the chlorine-based gas at high temperatures of not less than 600° C., they were sometimes corroded. To the contrary, it was discovered that the corrosion-resistant member according to the present invention exhibits higher corrosion resistance at not less than 600° C. against the chlorine-based gas than against the fluorine-based gas.

As the chlorine-based gases, $Cl_2$, $BCl_3$, $ClF_3$, HCl, etc. may be recited.

Preferably, a film of silicon carbide is a completely compact body having a high purity with the theoretical density.

In a preferred embodiment of the present invention, a corrosion-resistant member is a heater for heating, up to 600° C. or more, an object to be heated, which has a resistive heating element buried in a substrate. This embodiment will be explained.

In a semiconductor-producing apparatus, a heater is known in which a metallic resistive heating element is buried in a sintered body of aluminum nitride. However, a heater has not been known, which would be favorably used without a surface of a substrate for the heater being peeled at its surface in the state that the heater is exposed to heat cycling between a high temperature range of particularly 600° C. and 1100° C. and room temperature and also to a corrosive gas, particularly a chlorine-based corrosive gas. Therefore, such a heater has been strongly demanded.

The present inventors have succeeded in developing an epoch-making heater which solves the above problems by burning a resistive heating element in a sintered body of aluminum nitride and coating the entire surface of the sintered body.

That is, a film of silicon carbide formed by the chemical vapor deposition exhibits extremely high corrosion resistance against the chlorine-based corrosive gas in a high temperature range of not less than 600° C., and could provide a heater having high strength against the heat cycling.

The reason is considered as follows:

The temperature at which a film of silicon carbide is formed on the aluminum nitride sintered body by the chemical vapor deposition is ordinarily in a range of 1200° to 1500° C. No stress occurs between the sintered body and the silicon carbide film due to a difference in coefficient of thermal expansion in forming the silicon carbide film. However, if the corrosion-resistive member is cooled from a film-forming temperature to room temperature, stress occurs between the silicon carbide film and the sintered body due to a difference in thermal expansion therebetween. Since the coefficient of thermal expansion of silicon carbide is smaller than that of aluminum nitride, shrinkage during cooling of the former is smaller than that of the latter. Therefore, since the silicon carbide film is pressed by the sintered body having a larger shrinkage during cooling, compression stress occurs in a plane direction of the silicon carbide film. To the contrary, tensile stress remains in the sintered body. That is, an extremely large compression stress already exists inside the silicon nitride film at room temperature.

If heat is applied to a susceptor as in the present invention from an external heat source (for example, an infrared lamp) in this state, the heat from the external heat source first enters the silicon carbide film, and then transmits into the aluminum nitride sintered body. At that time, the entire silicon carbide film is first rapidly heated to conspicuously raise its temperature, while the temperature of the sintered body does not rise. In this state, since the silicon carbide film expands prior to the sintered body, not only compression stress originally existing in the silicon carbide film but also additional compression stress act upon the film, the silicon carbide film peels from the sintered body.

To the contrary, if a film of silicon carbide is integrated with a sintered body of aluminum nitride in which a resistive heating element is buried, heat is conducted from the resistive heating element into the aluminum nitride sintered body, so that the heat reaches the silicon carbide film at the sintered body through an interface between them. Since the heat capacity of the sintered body is far larger than that of the silicon carbide film and the film is thinner than the sintered body, a difference in temperature between the silicon carbide film and the outermost peripheral area of the sintered body is smaller and the temperature of the silicon carbide film is lower, when heat is conducted from the sintered body to the silicon carbide film during heating.

When the corrosion-resistant member is heated in such a temperature distribution, the aluminum nitride sintered body expands more largely than the silicon carbide film, and the compression stress present in the silicon nitride film is mitigated at room temperature. Owing to this, stress which occurs in the silicon carbide film is lowered on heating as compared with that at room temperature, so that the film is not peeled.

On the other hand, when such a heater is cooled from high temperatures, it is cooled in the state that the temperature of the silicon carbide film is necessarily being kept lower than that of the sintered body. Accordingly, the stress occurring in the silicon carbide film is smaller than that at room temperature. It is considered that as a result, the heat of the present invention, in which the silicon carbide film is closely adhered to the aluminum nitride sintered body at room temperature, does not peel the silicon nitride film even during cooling.

Although the material of the network member to be buried in the substrate is not limited, it is preferably made of a high melting point metal.

As such a high melting point metal, tantalum, tungsten, molybdenum, platinum, rhenium, hafnium and alloys of any of them may be recited by way of example. When the heater is installed inside a semiconductor-producing apparatus, tantalum, tungsten, molybdenum, platinum, and alloys of any of them are preferred from the standpoint of preventing contamination of semiconductors.

Particularly, pure molybdenum, and alloys of molybdenum and other metal(s) are preferred. As the metals to be alloyed with molybdenum, tungsten, copper, nickel and aluminum are preferred. As conductive materials other than the metals, carbon, TiN and TiC may be recited by way of example.

As the resistive heating element to be buried in the aluminum nitride sintered body, a metal wire in the form of a coil spring, a metallic foil and metallic sheet and plate are preferred. Their configurations themselves are known in the heater field.

As a more preferable example of the heater in this embodiment, the resistive heating element, which is buried in the aluminum nitride sintered body, is at least partially made of a conductive network member and aluminum nitride is charged into meshes of the network member. Such a structure exhibits more conspicuous durability against repeated heat cycling between a high temperature range to a low temperature range, particularly the room temperature range. Further, if non-uniform pressure is exerted upon the network member due to non-uniform densities of a raw ceramic material between the network member and the surface 2a of the heater molded body, an excess amount of the raw ceramic material moves toward the rear surface side of the molded body through the meshes.

The material constituting the network member is preferably a fibrous material or wire material. If the fiber or the wire has a round section, it can largely reduce stress concentration occurring from the thermal expansion.

In a preferred embodiment, the network member may be a slender band-like network member. Since current flows in a longitudinal direction of the band-like network member, the temperature is unlikely to occur, owing to non-uniform temperatures upon the concentration of the current as compared with the network member made of the round-section fibers or wires. Particularly, when the band-shaped network member is uniformly distributed for every portion of the substrate, the temperature of the heating surface of the substrate can be made more uniform. From this point of view, it is more preferable to make the heating surface of the substrate almost parallel to the main plane of the network member.

The planar shape of the network member and the diameter of the wires constituting the network member are not particularly limited. The wire is preferably a metallic wire made of a pure metal with the purity of not less than 99% and formed by rolling and drawing. The resistivity of the metal constituting the metallic wire is preferably not more than $1.1\times10^{-6}$ Ω·cm, and more preferably not more than $6\times10^{-6}$ Ω·cm at room temperature.

Further, it is preferable that the width of the metallic wires constituting the network member is not more than 0.8 mm, and that not less than 8 warp wires cross not less than 8 weft wires per 1 inch×1 inch. By setting the width of the wire to 0.8 mm or less, the heat-generating rate of the wire is fast to make the heat-generated amount appropriate. When the width of the wire is not less than 0.02 mm, concentration of current is unlikely to occur due to excess heat generation of the wire. The diameter of the wires constituting the network member is preferably not less than 0.013 mm, and more preferably not less than 0.02 mm.

By setting the number of the wires per inch at not less than 8, current flows easily and uniformly over the entire network member, and less current concentrates inside the wires constituting the network member. From the standpoint of the actual production, it is preferable that not more than 100 warp wires cross not more than 100 weft wires per 1 inch×1 inch).

The cross-sectional shape of the network member-constituting wire as viewed in a width direction may be circular, elliptical, rectangular, or any rolled shape.

The heater according to the present invention can be produced by the following method, for example.

Method 1

A preliminarily molded ceramic body is produced, and a network member is placed on this preliminarily molded ceramic body. Then, a ceramic powder is charged onto the preliminarily molded ceramic body and the network member, which is uniaxially press molded. The press molded body is sintered by hot press, while being pressurized in the thickness direction of the network member, thereby obtaining a sintered body. A film of silicon carbide is formed on a surface of the sintered body as mentioned later.

The hot press pressure needs to be not less than 50 kg/cm², preferably not less than 100 kg/cm². Taking the performance of the actual HP apparatus into consideration, the hot press pressure is ordinarily not more than 2,000 kg/cm² or less.

Method 2

Two planar molded bodies are produced by cold isostatic press, and a network member is sandwiched between the two planar molded bodies. The resulting assembly is sintered by hot press, while two molded bodies and the network member are being pressed in the thickness direction of the network member, thereby obtaining a sintered body. A film of silicon carbide is formed on a surface of the sintered body as mentioned later.

Figure 1B:
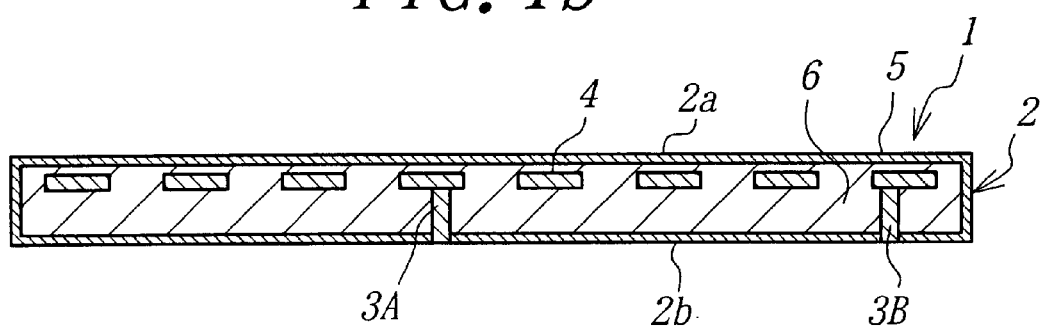

FIG. 1(a) is a plane view showing a heater 1 according to one embodiment of the present invention, and FIG. 1(b) a sectional view of FIG. 1(a) along with a line Ib—Ib.

In the heater 1, a network member 4 is buried inside a discoid substrate 2, for example. In a central portion of the substrate 2 is buried a terminal 3A exposed to its rear surface 2b, and a terminal 3B is buried in a peripheral portion of the substrate 2, and is exposed to the rear surface 2b. The terminals 3A and 3B are connected to the network member 4. A reference numeral 2a denotes a heating face of the substrate. In FIGS. 1(a) and 1(b), fine meshes of the network member are not shown due to the dimensional limitation of the drawings. The network member 4 takes a swirled shape as viewed between the terminals 3A and 3B on the average. The terminals 3A and 3B are also connected to a power supply cable not shown. The substrate 2 is constituted by a discoid sintered body 6 of aluminum nitride and a film 5 of silicon carbide covering the surface of the sintered body 6.

Figure 2A:
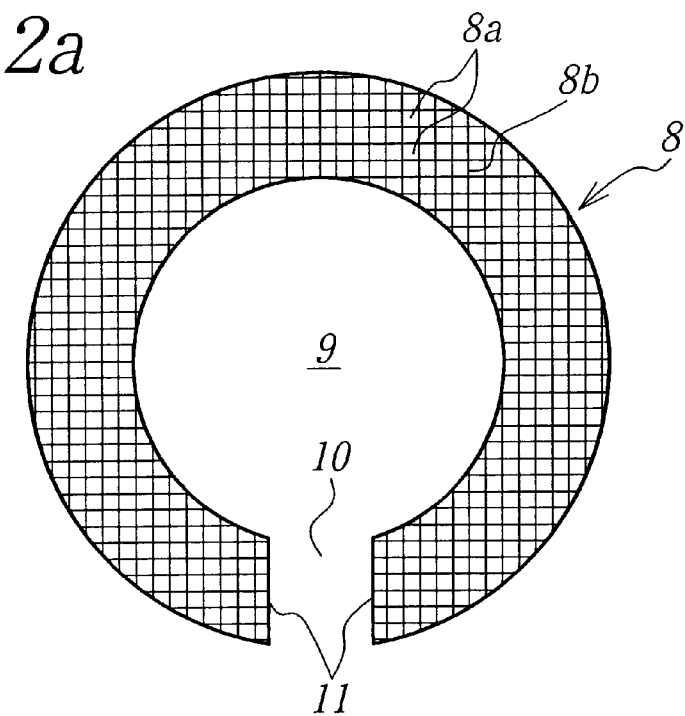
FIG. 2(a) is a plane view showing an example of a network member for a network member, FIG. 2(b) being a plane view schematically showing a heater in which the network member in FIG. 2(a) is buried.
Figure 2B:
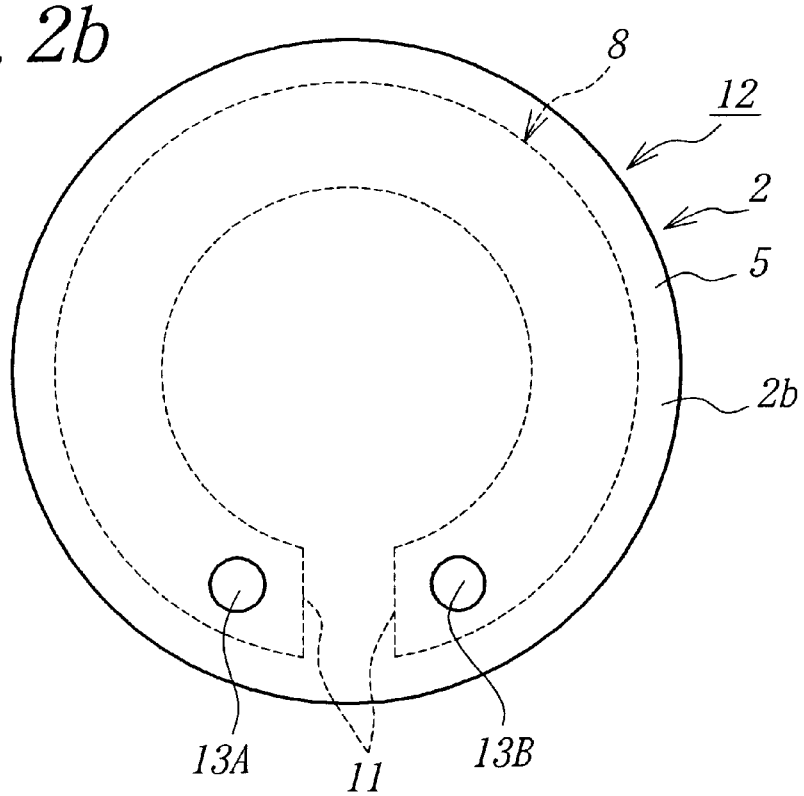

FIG. 2(a) is a plane view showing a network member 8 to be used in another embodiment, and FIG. 2(b) is a plane view schematically showing a heater 12 in which the network member 8 is buried.

The network member 8 is made of wires 8a vertically and laterally knitted. A reference numeral 8b denotes a knitted point. The network member 8 has an almost circular outer periphery with an almost circular inner periphery, so that the entire network member 8 takes almost annular shape with a circular inner space 9 inside the annular shape. A cut 10 exists in the network member 8, and a pair of end portions 11 of the network member 8 are opposed to each other through the cut 10.

In heater 12, a network member 8 is buried in a sintered body 2, and terminals 13A and 13B are connected to a pair of the respective end portions of the network member 8. By so doing, current flows through a circular path between the terminals 13A and 13B along the longitudinal direction of the annular network member 8, so that the concentration of current can be prevented.

FIG. 3(a) to FIG. 3(c) are sectional views showing various configurations of network members by way of example. In the network member 16 shown in FIG. 3(a), weft wires 16a and warp wires 16b are knitted to cross each other three-dimensionally, and the weft wires 16a and the warp wires 16b are waved. In the network member 17 of FIG. 3(b), weft wires 17a are straight, and warp wires 17b are bent. In the network member 18 of FIG. 3(c), weft wires 18a and warp wires 18b are knitted to cross each other three-dimensionally, and the weft wires and warp wires are waved. The network member 18 is rolled, so that the outer configurations of the weft wires and the warp wires extend along one-dotted lines A and B, respectively.

For example, the network member shown in FIG. 3(c) is particularly preferred, because it has the most excellent flatness and the warp wires contact the weft wires contact each other most assuredly.

Figure 4:
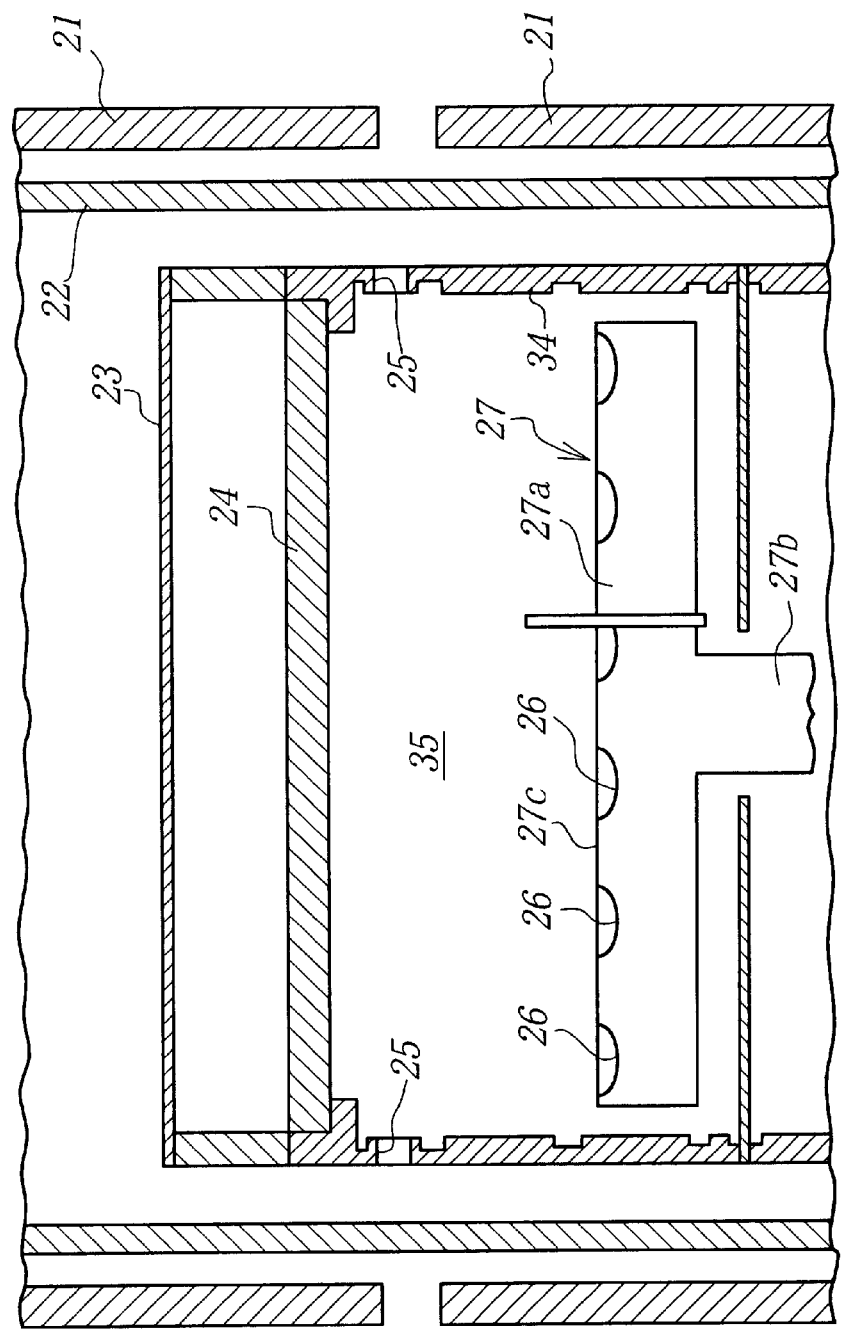
FIG. 4 is a sectional view schematically showing an apparatus suitable for forming a film of silicon carbide on a surface of a sintered body of aluminum nitride by chemical vapor deposition.

A preferred example of a method for producing a film of silicon carbide will be explained. A sintered body 24 is placed in a chemical phase deposition (CVD) furnace schematically shown in FIG. 4. The sintered body 24 is supported by a holding jig 23. A reference numeral 34 denotes a jig. In this embodiment, a raw material feed pipe 27 having a T-letter shaped front face is arranged. The raw material feed pipe 27 includes a laterally extending blowing portion 27a and a base portion 27b, and a given number of gas blow-out openings 26 are provided at a side of a front face 27c of the blow-out portion 27a opposed to the sintered body. Reference numerals 21 and 22 denote an external heater and an inner cylinder of the furnace, respectively.

The distance between the sintered body 24 and the surface 27c of the raw material feed pipe 27 is set at 100 mm to 300 mm, for example. While the raw material feed pipe 27 is being rotated, gases are blown out through the gas blow-out openings 26. The CVD raw material gases blow out through the gas blow-out openings 26, flows through a space 35 and impinges the surface of the sintered body 24. Then, the gases flow along the sintered body 24, and are discharged through gas exhaust openings 25 provided in the holding jig 24.

While the raw material feed pipe thus constructed is used and being rotated, the gases are blown out to enable the thickness of a film of silicon carbide covering the entire surface of the sintered body 24 and its electric resistivity uniform to be uniform.

Preferably, after hydrogen is continuously flown through the interior of the furnace at a film-forming temperature, silicon tetrachloride and methane are introduced into the furnace to from a film of silicon carbide. Flowing hydrogen at the film-forming temperature before flowing the raw material gases enhances adhesion between the sintered body and the silicon carbide film.

It is more preferable that hydrogen is flown at the film-forming temperature, at least a first silicon source compound gas containing silicon, chlorine and hydrogen is then flown, and subsequently a gas composed of a second silicon source compound and a carbon source gas is flown. As the first silicon source compound, at least one compound selected from the group consisting of $SiCl_4$, $SiHCl_3$ and $SiH_2Cl_2$ is preferred. As the second silicon source compound, at least one compound selected from the group consisting of $SiCl_4$, $SiHCl_3$, $SiH_2Cl_2$ and $SiH_4$ is preferred. As the carbon source compound, at least one compound selected from the group consisting of $CH_4$, $C_2H_6$ and $C_3H_8$ is preferred. The first silicon source compound is preferably the same as the second one, but they may differ from each other.

Introduction of at least the silicon source compound gas containing chlorine at the high temperature range in the chemical vapor deposition process reacts silicon chloride with hydrogen to generate hydrogen chloride through decomposition. The surface of aluminum nitride is corroded and activated with this hydrogen chloride gas. It is considered that silicon atoms bond to the activated surface to form silicon nitride, silicon is easily reactable with carbon further introduced thereon, and the thus formed silicon nitride is easily adhered to the underlying silicon nitride. The timing for introducing the first chlorine-containing silicon source compound, for example $SiCl_4$ can be appropriately determined so that an intermediate layer may be formed in a desired thickness depending upon the film-forming temperature. The film-forming temperature is preferably 1350 to 1500° C., more preferably 1400 to 1450° C.

The heat cycling resistance between the sintered body and a film of silicon carbide could be improved by setting the purity of aluminum nitride of the aluminum nitride sintered body at not less than 90% and preferably not less than 94%. The reason is that this can suppress adverse effects of oxides in the sintered body. The relative density of the sintered body is preferably not less than 90% from the viewpoint of strength. In the semiconductor-producing apparatus, the content of metals other than aluminum in aluminum nitride is preferably suppressed to not more than 1%.

Further, the present inventors discovered that particularly if the silicon carbide film having the specific structure obtained by improving the chemical vapor deposition as mentioned above is applied to the heater in which the resistive heating element is buried, the heater exhibited particularly excellent corrosion resistance and heat cycling resistance.

Figure 5:
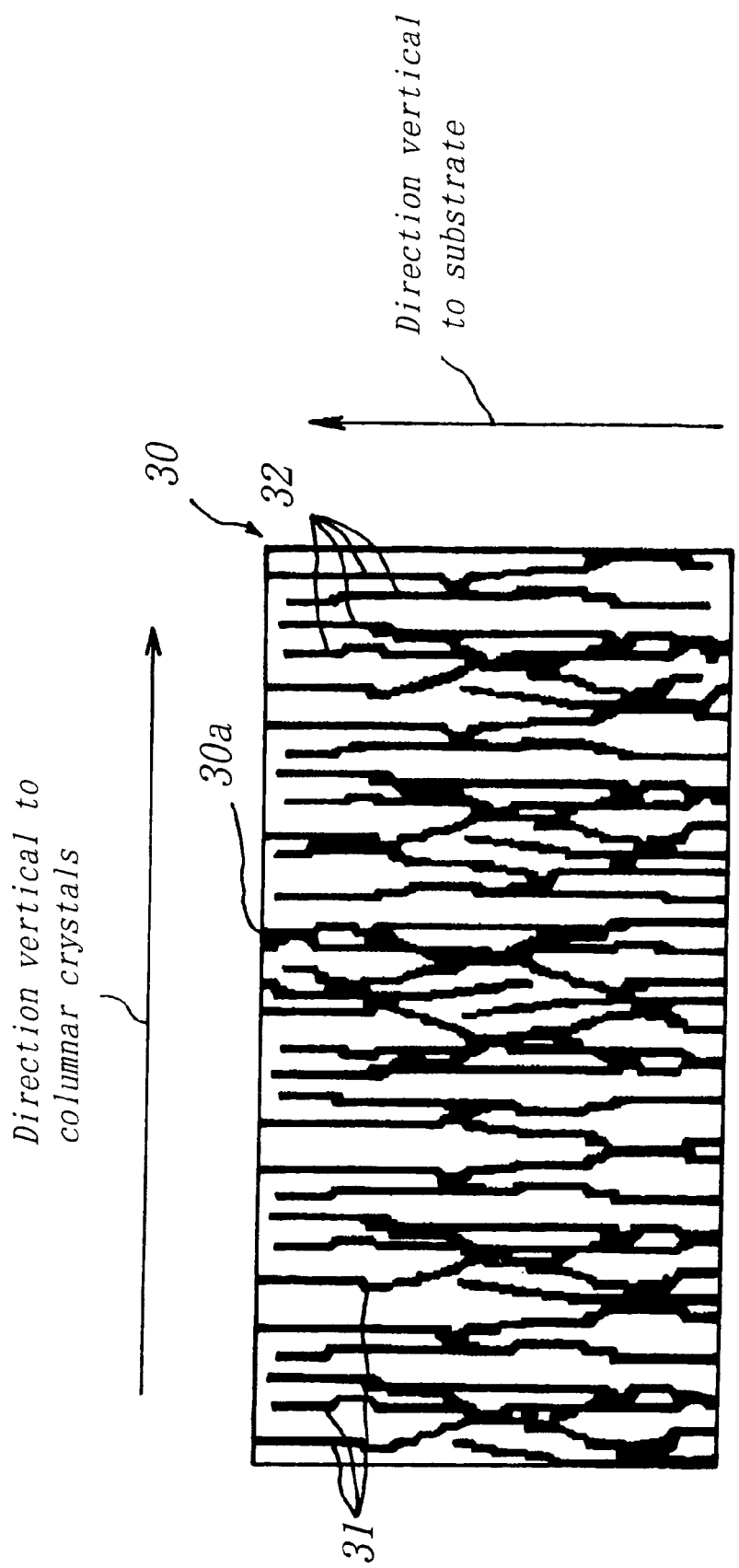
FIG. 5 is a sectional view schematically showing a microstructure suitable for a film of silicon carbide.

That is, the silicon carbide film obtained above is made of columnar crystals extending in a direction almost vertical to or crossing the surface of the film. The shapes of such columnar crystals are schematically shown in FIG. 5. The silicon carbide film is composed of a number of columnar crystals 31. The columnar crystals 31 extend in a direction almost vertical to the surface 30a of the silicon carbide film 30 as a whole. The grain boundary 32 of each of the columnar crystals 31 also extends in a direction almost vertical to the surface 30a of the film 30. That is, the plane (111) of the columnar crystal 31 is oriented in a direction vertical to the surface of the film.

That the columnar crystals 31 extend in a direction almost vertical to the surface 30 of the silicon carbide film does not means that all the columnar crystals 31 extend almost vertical to the surface 30a, but means that when the silicon carbide film is measured by the X-ray diffraction process, the intensity of the (111) plane of the columnar crystal 31 as observed from the side of the surface 30a of the film is not less than 8 times as much as viewed from a side vertical to the surface 30a of the film.

The aspect ratio of the columnar crystal is preferably 1.5 to 20, more preferably 4 to 10.

The present inventors observed tips of the columnar crystals at the surface of the silicon carbide film after the chemical vapor deposition. As a result, facets each having a pyramid shape appeared at the surfaces of the tips of the columnar crystals. The facet having the pyramid shape is considered to show the shape of growing faces of each columnar crystal. Therefore, it is considered that the diameter of the columnar crystals extending at the underside can be represented by the distribution in the diameters of the bottom surfaces of the pyramid facets. If a rectangular shape is taken for the bottom face of the facet as observed from a side of the front surface of the film, the diameter of the pyramid facet means the distance of one corner of the rectangular shape to another corner on a diagonal between them.

It is discovered that if the average diameter of the facets is not less than 4 $\mu$m and not more than 6 $\mu$m and the ratio of the occupying area of the facets having the diameters of not less than 20 $\mu$m to the entire area of the facets is not less than 10% and not more than 80%, the facet is observed from the front surface side of the silicon carbide film, corrosion resistance and heat cycling resistance can be particularly improved.

EXAMPLE

Powdery aluminum nitride obtained by the reducing/nitriding method was used. In this powder, the content of each of Si, Fe, Ca, Mg, K, Na, Cr, Mn, Ni, Cu, Zn, W, B and Y was not more than 100 ppm, and other metal other than the above was detected except for aluminum. A discoid preliminarily molded body was produced by uniaxially press molding the above raw material powder. A resistive heat-generating wire made of molybdenum in the form of a coil spring was buried in the preliminarily molded body during molding. The preliminarily molded body was hot pressed at 1900° C. under pressure of 200 kgf/cm², thereby obtaining a sintered body of aluminum nitride. The sintered body was 250 mm in diameter and 20 mm in thickness.

The surface of the thus obtained sintered body was worked, and the sintered body was placed in a chemical vapor deposition (CVD) reaction furnace where a film of silicon carbide was formed on the surface of the sintered body in a thickness of 50 $\mu$m. More specifically, an apparatus shown in FIG. 4 was used. Argon was flown during heating up to 1425° C., hydrogen was flown for 10 minutes at 1425° C., then $SiCl_4$ in addition to hydrogen and argon was flown at a rate of 5.2 liters/min. for 1 minutes, and subsequently $CH_4$ in addition to argon, hydrogen, $SiCl_4$ was flown at 4 liters/min. for 10 minutes. Since $SiCl_4$ is liquid, while its vapor pressure was raised by heating $SiCl_4$, a carrier gas was led and a gas containing $SiCl_4$ was obtained under bubbling. This gas was introduced into a reaction furnace. The film-forming pressure was 120 Torr.

This heater was exposed to chlorine plasma at 825° C. At that time, the flow rate of the chlorine gas was 300 SCCM, the pressure 0.1 Torr, the AC power 800 watts, and the exposed time period 2 hours. As a result, the weight of the silicon carbide film was reduced by less than 0.1 mg/cm². Observation of the surface of the silicon carbide film after the corrosion test with a scanning type electron microscope revealed that both the surface state and the grain boundary phase did not changed from those before the corrosion test, with no reaction layer formed.

Next, a silicon wafer was placed on the heater, and exposed to the plasma under the same condition as mentioned above. The level of contamination of Al onto the silicon wafer was $10^{10}$ atm/cm$^2$. Since the level of $10^{10}$ atm/cm$^2$ was the same as the contamination level of the wafer before the exposure, the silicon wafer was plasma treated under heating in this Example with substantially no contamination of the wafer.

Further, this heater was subjected to a heat cycling test. That is, the temperature of the surface of the heater was alternatively raised and lowered to not more than 30° C. and 900° C., respectively, by turning off and on the resistive heating element. At that time, oxidation of the aluminum nitride was prevented by holding it in argon atmosphere. The heater was held at 900° C. for 1 minute, the resistive heating element was turned off, and the heater was cooled by blowing argon gas to the heater at 2 liters/minutes for 120 minutes. After it was confirmed that the heater reached a temperature of not more than 30° C., its surface temperature was raised to 900° C. by passing current through the resistive heating element. The heater in this Example causes no peeling of the silicon carbide film even after 2000 heating cycles.

Further, observation of the microstructure of the silicon carbide film with the scanning type electron microscope shows a microstructure schematically shown in FIG. 5. The average diameter of facets was 3.2 μm, the ratio of the facets having diameters of not less than 20 gm to the entire area of the facets 43%, and the aspect ratio of columnar crystals not less than 8.

COMPARATIVE EXAMPLE

A heater was produced in the same manner as in Invention Example. No film of silicon carbide was formed. This heater was subjected to the corrosion test with the above chlorine-based gas, which revealed that the weight of the heater was reduced by 0.8 to 1.4 mg/cm$^2$ depending on locations. The level of contamination of Al onto the silicon wafer was $10^{15}$ atm/cm$^2$.

As mentioned above, according to the present invention, the corrosion-resistant member exhibiting high corrosion resistance against the chlorine-based gas at 600° C. or more can be provided, and the heater which causes neither surface degradation nor peeling of the surface of the corrosion-resistant member even upon heating cycles between the exposure to the chlorine-based gas at 600° C. and the low temperature can be provided.

What is claimed is:

1. A corrosion-resistant member comprising an AlN sintered body and a SiC film formed on a surface of said AlN sintered body by chemical vapor deposition, said SiC film comprising columnar crystals extending substantially perpendicularly to the surface of said SiC film, the average aspect ratio of said crystals ranging from 1.5–20, wherein facets are formed on said surface of said SiC film, the average particle diameter of said facets ranging from 4 μm to 6 μm and an area ratio of said facets having diameters of at least 20 μm to the entire area of said facets ranging from 10% to 80% as viewed from said surface of said SiC film, whereby said member resists corrosion when exposed to a chlorine-based gas atmosphere at temperatures of at least 600° C.

* * * * *